United States Patent [19]

Babcock

[11] Patent Number: 5,010,297

[45] Date of Patent: Apr. 23, 1991

[54] AUTOMATIC TEST EQUIPMENT WITH ACTIVE LOAD HAVING HIGH-SPEED INHIBIT MODE SWITCHING

[75] Inventor: Douglas W. Babcock, Londonderry, N.H.

[73] Assignee: Analog Devices, Incorporated, Norwood, Mass.

[21] Appl. No.: 444,815

[22] Filed: Dec. 1, 1989

[51] Int. Cl.⁵ ............................................. G01R 19/00
[52] U.S. Cl. ................................. 324/158 R; 324/731
[58] Field of Search ......................... 324/158 R, 73.1;
364/580; 371/15.1, 25.1, 20.1; 307/270; 437/8

[56] References Cited

U.S. PATENT DOCUMENTS

| | | | |
|---|---|---|---|
| 4,348,759 | 9/1982 | Schnurmann | 324/73.1 |
| 4,495,462 | 1/1985 | Weldon | 324/158 R |
| 4,636,716 | 1/1987 | Welzhofer | 324/158 R |
| 4,646,299 | 2/1987 | Schinabeck et al. | 324/73.1 |
| 4,651,088 | 3/1987 | Sawada | 324/158 R |
| 4,712,058 | 12/1987 | Branson et al. | 324/158 R |
| 4,720,671 | 1/1988 | Tada et al. | 324/158 R |

*Primary Examiner*—Kenneth Wieder
*Assistant Examiner*—Vinh P. Nguyen
*Attorney, Agent, or Firm*—Parmelee, Bollinger & Bramblett

[57] ABSTRACT

Automatic test equipment (ATE) for post-production testing of multi-pin integrated circuits (ICs). Each pin is assigned to a pin card having a pin driver and an active load with the latter including both a current source and a current sink. The pin driver and active load are connectable alternatively to the IC pin in response to complementary inhibit signals. Within the active load, the source and sink and connected/disconnected by respective pairs of matched transistor switch circuits the individual switches of which are alternatively activatable by differential control means. Both switch circuits of each pair are supplied from a single current source. One switch circuit of each pair, when activated, directs the current from the single current source to (from) the IC pin, while the other switch circuit, when activated, directs the current to (from) a return line. All of the switch circuits include Darligton-connected transistors and an additional transistor to draw base charge from the principal Darlington transistor when the switch is turned off.

10 Claims, 4 Drawing Sheets

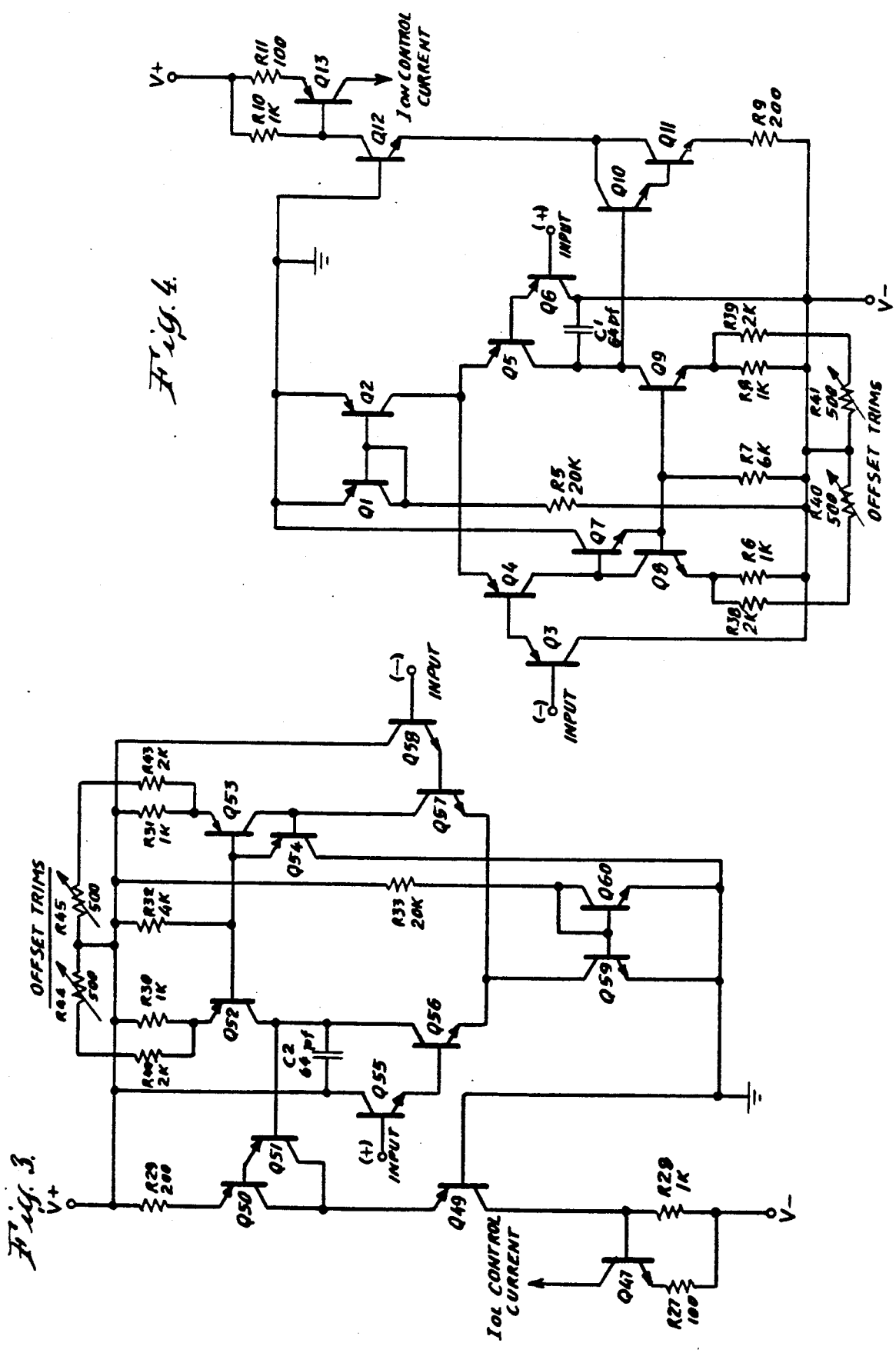

AUTOMATIC TEST EQUIPMENT WITH ACTIVE LOAD HAVING HIGH-SPEED INHIBIT MODE SWITCHING

FIELD OF THE INVENTION

This invention relates to automatic test equipment (ATE) used for high-speed production line testing of multi-pin integrated circuits (ICs). More particularly, this invention relates to improved active loads forming part of such test equipment. Active loads are connected to those IC pins which are monitored for response to test signals applied to other pins of the device under test (DUT).

BACKGROUND OF THE INVENTION

Automatic test equipment has been used for many years to evaluate the performance of ICs prior to shipment to customers. With the steadily increasing complexity of ICs, there has been a corresponding need for higher speed test equipment, so that the overall time for testing can be kept within reasonable limits. Recently, ICs have become so complex (e.g. with 500 or so pins per chip) that the test equipment must be able to operate at a toggle rate as high as 200 MHz. At that rate, each test cycle must be completed within the 5 nano-second ($5 \times 10^{-9}$ seconds) cycle time of the test sequencing.

Such automatic test equipment includes a large number of "pin cards" carrying circuitry for communicating with a corresponding pin of the device under test. Each pin card includes a so-called "pin driver" which is connectable to a corresponding pin of the device under test to supply a test signal thereto. The output voltages at one or more other pins of the device are monitored during the test period, and are compared to programmed voltages to determine whether applicable specifications have been met. During the test period, the pin being monitored also must be connected to an active load which forces a predetermined current into (or out of) the pin, to insure that proper test conditions are maintained at the time of testing. During each test period, each pin will be connected to either a pin driver or to an active load, depending upon whether the pin is to receive a test signal, or whether its output response is to be measured.

As the test program proceeds, many of the pins must be sequentially switched between the pin driver and the active load of the corresponding pin card. Thus, the pin driver and the active load must be capable of being connected and disconnected from the corresponding pin at very high speed so as to achieve proper test conditions within each test period. Most importantly, when the active load is being turned off (in response to an "inhibit" signal), extremely fast switching for the turn-off is essential in order to be sure that the current into or out of the active load does not affect the pin driver which is being turned on at about the same time.

SUMMARY OF THE INVENTION

In a preferred embodiment of the invention, to be described hereinbelow in detail, there is provided an active load of the type including a four-terminal diode commutation bridge the output terminal of which is connected to a pin of the device under test (DUT). Another terminal of this bridge is supplied with a commutation voltage, the function of which will be explained. The remaining two terminals are current input/output nodes connected respectively to the current source and the current sink of the active load. The output of each of these devices is controlled by a respective switch responsive to inhibit signals so as to turn on (or off) the current source/sink, thereby in effect to connect (or disconnect) the active load from the corresponding pin of the device under test.

The switches for the current source and current sink of the active load each comprise a pair of matched switch circuits supplied with current from a corresponding single source of current. Current through one of the matched switch circuits of each pair leads to a corresponding one of the diode bridge current input/output nodes, while current through the other switch circuit of each pair is directed to a return line, e.g., ground. The matched switch pairs are operable by corresponding differential switch control circuitry which serves in response to inhibit signals to turn on (or off) one or the other of the switch circuits of the corresponding pair. The turned-on switch circuit will conduct the current of the single source of current to (or from) its designated circuit point, which will be either the corresponding current input/output node of the diode bridge, or the return line.

When the inhibit signal goes high to disconnect the active load from its corresponding pin, the currents of both the source and the sink of the active load are diverted from the switch circuits leading to the pin, to the switch circuits which lead to the return line. Thus, under inhibit conditions no current flows into (or out of) the diode bridge. That is, the active load is in effect disconnected from the DUT. When the inhibit signal goes low, the currents of both the source and the sink flow respectively through the switch circuits of each pair which lead to the current nodes of the diode bridge, so that current is made available to be supplied to (or from) the DUT.

The differential switch control circuitry for each switch pair serves not only to connect/disconnect the active load to/from the device under test in response to a change in the inhibit signal, but in addition serves to set the magnitudes of the currents flowing through the switch circuits in correspondence to programmed control voltages. This result is achieved by a feedback circuit including a sensing resistor in series with the current flowing through the switch pairs. This sensing resistor develops a feedback signal which is fed together with the programmed control voltage to a control amplifier which adjusts the current through the corresponding differential switch control circuit to force the current through the active switch circuit to equal the programmed value.

By virtue of the topology of the matched switch circuit pairs and the differential switch control circuitry, the current flowing to the switch circuitry does not change during switchover, since the current is simply diverted from one of the matched switch circuits to the other. This avoids the loss of time which otherwise would be required for changing the current level during switchover, and thereby speeds up the switching function. The switch circuitry also includes special provisions to enhance the speed of switching, particularly for switching off the active load as the pin driver comes on.

Accordingly, the present invention is directed to providing automatic test equipment with an active load which is capable of very high speed switching between on and off states. Other objects, aspects and advantages of the invention will in part be pointed out in, and in part apparent from, the following detailed description of a presently preferred embodiment of the invention, considered together with the accompanying drawings.

BRIEF DESCRIPTION OF THE DRAWINGS

FIG. 3 is a circuit diagram of one of the control amplifiers for the active load of FIGS. 2A and 2B; and FIG. 4 is a circuit diagram of another control amplifier for the active load of FIGS. 2A and 2B.

DETAILED DESCRIPTION OF A PREFERRED EMBODIMENT

Figure 1:
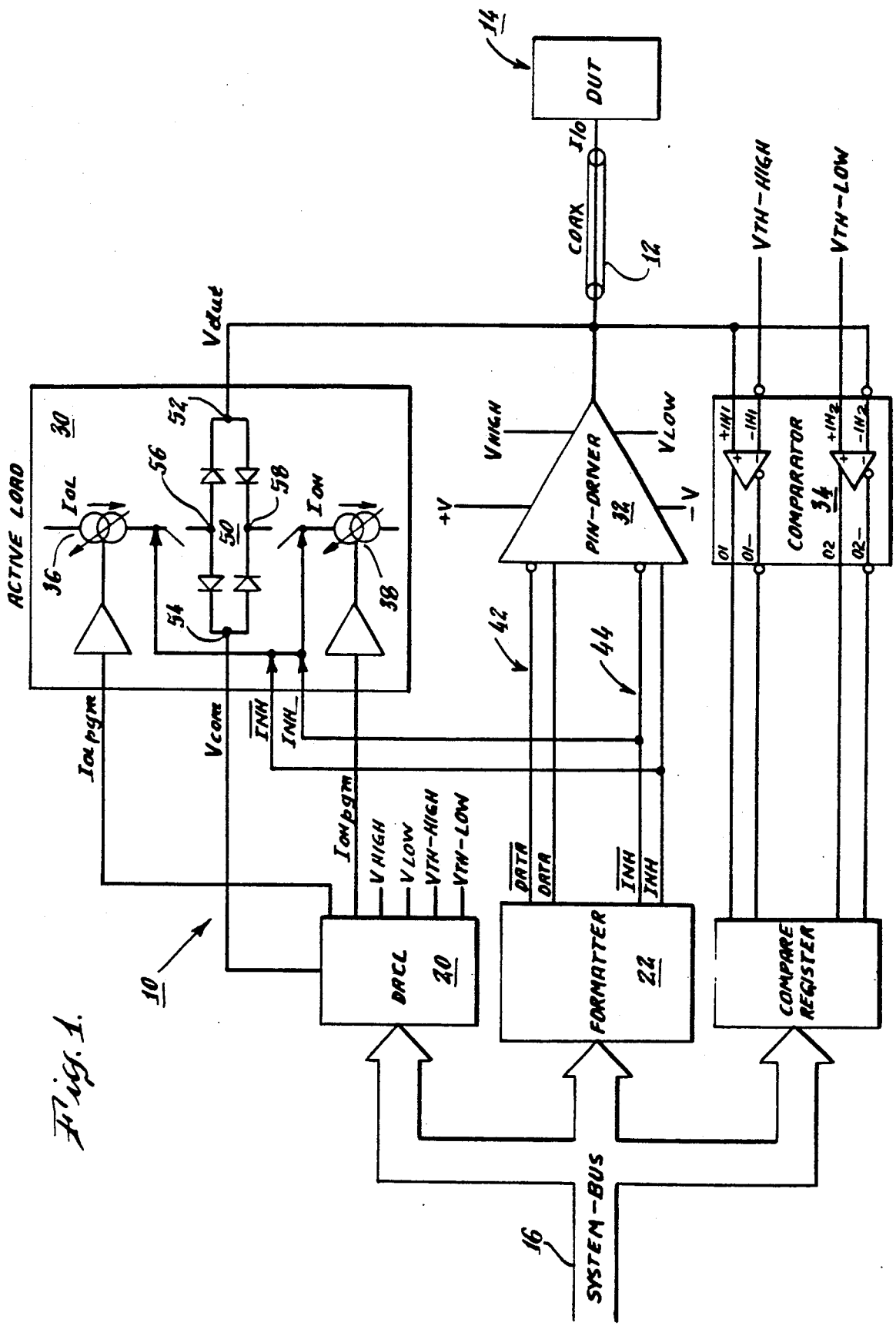
FIG. 1 is a block diagram showing the overall arrangement of automatic test equipment including an active load in accordance with the invention.

Referring first to FIG. 1, the automatic test equipment generally indicated at 10 is connected by a coax 12 to one pin of a device under test (DUT) 14. The DUT will have many pins (possibly 500 or so), and each pin is connected to a set of test equipment like that shown in FIG. 1. Such test equipment typically is arranged in the form of a pin card. The test equipment on all pin cards is controlled by a computer (not shown) which supplies digital control signals thereto over a system bus 16.

The digital control signals are received by a set of DACs 20 and by a formatter 22. The DACs produce various analog signals for distribution to the other equipment which includes an active load 30, a pin driver 32, and a set of comparators 34. For the active load 30, the analog signals include programmed low and high output currents IOL-PGM and IOH-PGM, specifying the magnitude of current from an adjustable source 36 and to an adjustable sink 38. For the pin driver 32, high and low pin voltages are specified at VHIGH and VLOW. For the measurement comparators 34, high and low threshold voltages are specified at VTH-HIGH and VTH-LOW. The output of the comparators is fed to a register 40 which provides the measurement results to the system bus 16.

The formatter 22 produces data on a pair of lines 42 in the form of ECL logic signals specifying whether the pin voltage to be developed is high or low, and also produces complementary ECL inhibit signals (INH and $\overline{INH}$) on a pair of lines 44 for switching the pin driver on and off. These inhibit signals also are directed to the active load 30 to turn the active load on and off, in opposite phase to the pin driver 32. That is, when the pin driver is on, the active load is off, and vice versa.

The active load 30 incorporates the usual four-terminal diode commutation bridge circuit 50. The bridge output terminal 52 is connected to the pin of the device under test, and the commutation terminal 54 is supplied with a predetermined commutation voltage VCOM. The source 36 and the sink 38 are connected to the current nodes 56, 58 of the diode circuit. When the active load is on (i.e., not inhibited), current can flow from the source 36 to the DUT pin, or from the pin to the sink 38, depending upon whether the pin voltage is below or above the commutation voltage VCOM. If the source supplies current to the pin, the sink will receive current from the VCOM terminal; if the sink receives current from the pin, the source supplies current to the VCOM terminal. Thus, when the active load is not inhibited, the source and sink are on continuously, regardless of which one is connected to the pin of the DUT.

The preferred embodiment of the invention provides for active load operation over a range of pin and VCOM voltages of from $-2$ volts to $+7$ volts, with supply voltages of $+10$ V and $-5.2$ V nominal. The magnitudes of the source and sink currents IOH-PGM and IOL-PGM can be set anywhere within the range of 0 to 50 mA, utilizing programming voltages of 0 to $+5$ volts.

Switching the active load 30 into its inhibit mode must be effected at extremely high speed, in order that the active load be disconnected from the DUT pin before the pin driver comes out of its inhibit mode. To assure the requisite speed of switchover, the currents of the source 36 and sink 38 are not simply shut off. Rather, the source and sink remain on, and their currents are simply diverted away from the DUT, as will be explained.

Figure 2A:
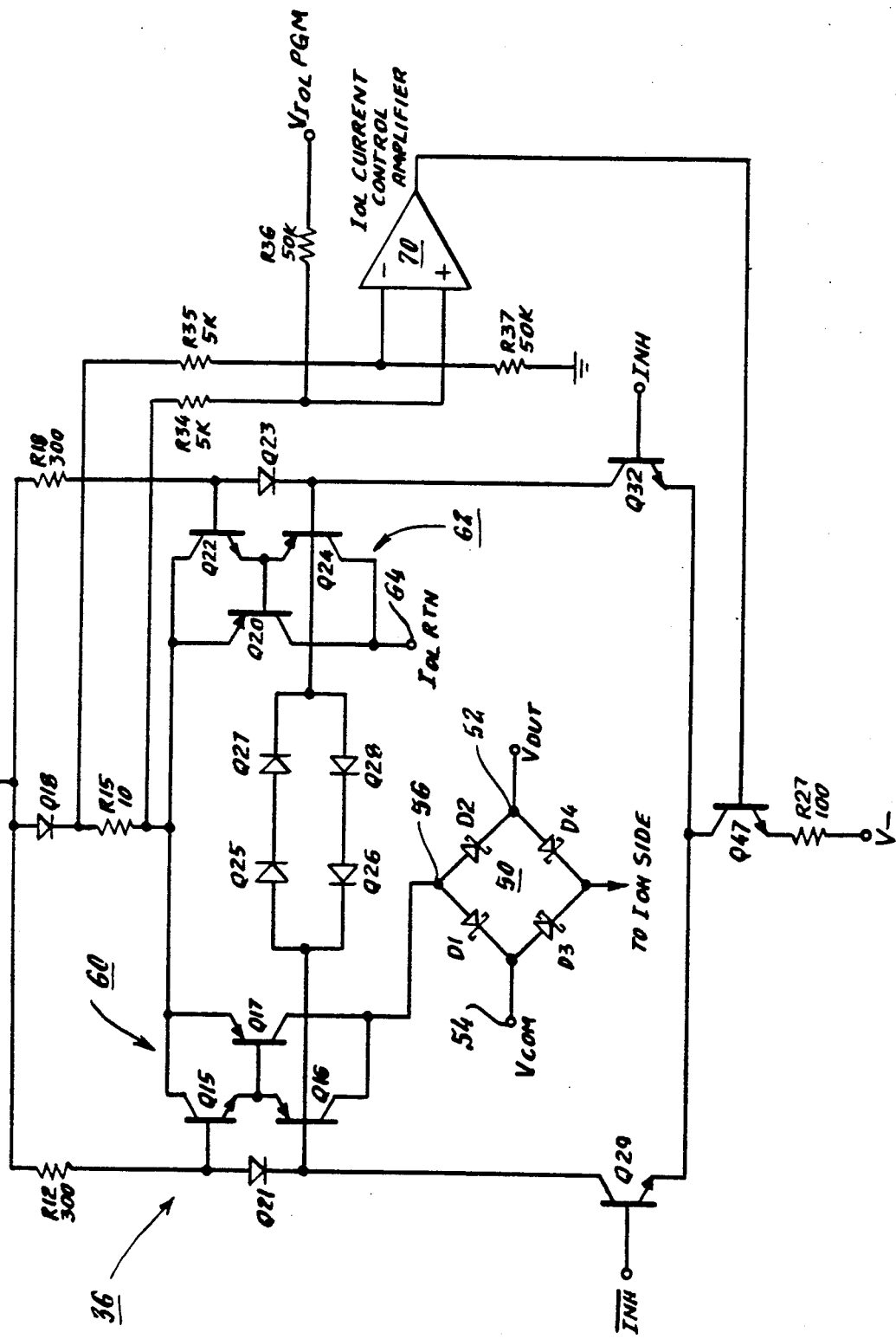
FIGS. 2A and 2B together present a schematic diagram of an active load including switch circuitry for turning the active load off and on, and control circuitry for setting the magnitude of its source and sink currents.
Figure 2B:
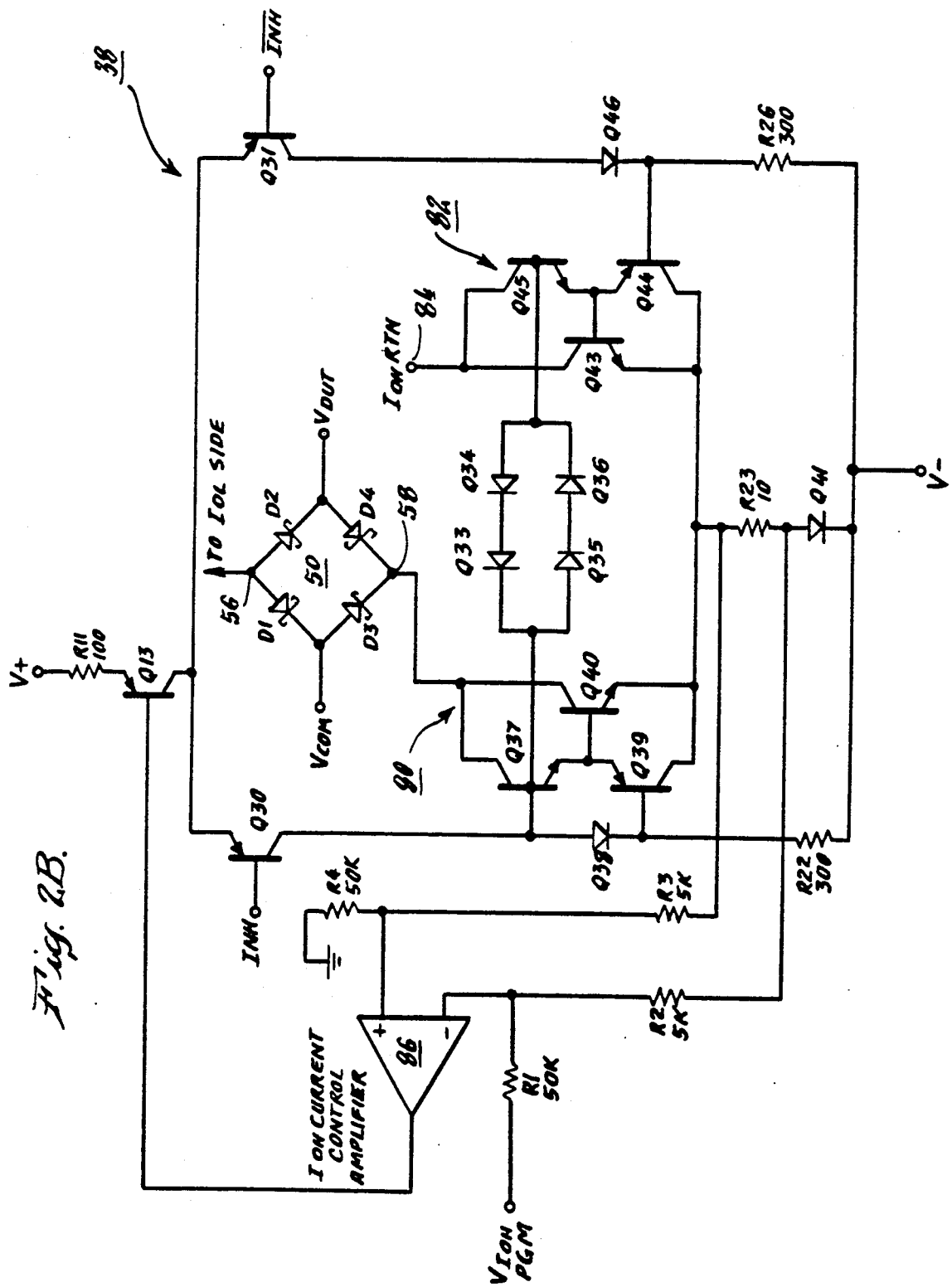

Referring now to FIG. 2A, which shows the positive half of the active load 30 (i.e., FIG. 2A shows the source 36, whereas FIG. 2B shows the sink 38), it will be seen that the current supplied to the upper current node 56 of the diode circuit 50 is derived from a transistor switch circuit generally indicated at 60. It should be noted that the diode bridge 50 although shown in both FIGS. 2A-2B, is not a part of the source (36) or sink (38) and is shown simply to clarify its connection to those element. This switch circuits (60) forms one half of a matched pair of such switch circuits, the other half being generally indicated at 62. The output of this latter switch circuit is directed to a return line 64, for example, ground.

Current is supplied to both switch circuits 60, 62 from a single source, comprising a small sensing resistor R15 in series with a diode Q18 connected to the positive supply rail V+. The switch circuits 60, 62 are controlled by differential circuit means including a pair of control transistors Q29, Q32 responsive to the complementary inhibit signals $\overline{INH}$ and INH. This differential circuit means includes resistors R12 and R18, and diodes Q21, Q23, and activates the switch circuits 60, 62 in a complementary fashion. That is, when one switch circuit is on, the other is off.

Each of the matched switch circuits 60, 62 includes one transistor Q17, Q20 which carries a principal part of the current. A second Darlington-connected transistor Q16, Q24 is provided to carry the base current of the first transistor. A third transistor Q15, Q22 is included in each switch circuit to draw off base charge from the first transistor when the switch goes off, in order to assure a speedy turn-off.

Clamp diodes Q25, Q27 and Q26, Q28 are connected between the bases of the Darlington transistors Q16, Q24 to allow only a 1.4 volt swing at the base of Q16 when the switch 60 turns off. This clamp circuit keeps the swing symmetrical no matter what the current is through the switch. The diode Q18 in series with the sensing resistor R15 allows the base of Q15 to be pulled high enough to turn on at low current levels.

When the inhibit signals INH, $\overline{INH}$ are toggled into inhibit mode (INH high), Q32 conducts and transistors Q20, Q24 turn on to direct current from R15 to the return line 64. At the same time, transistors Q16, Q17 are turned off to stop the flow of current to the diode bridge 50. Since the current from R15 remains constant and is merely steered from the left-hand switch 60 to the right-hand switch 62, fast and relatively symmetrical current switching is achieved. Typically, with a 50mA switch current, the current can be inhibited to within 10% of its 0 value within 1 nano-second. Enabling the current from inhibit to 90% of its 50mA maximum takes about 2 nano-seconds.

The magnitude of the current flowing through the activated switch circuit 60 or 62 is set by a feedback circuit including the sensing resistor R15 which produces a feedback signal proportional to the switch current. This signal is directed through resistors R34, R35 to the input terminals of a current control amplifier 70 (see also FIG. 3) the output of which is led to the base of a current transistor Q47 having its emitter connected through a 100 ohm resistor to the V- rail. A control voltage VIOL-PGM (standing for: voltage - output current, low - program) also is connected to the input of the amplifier 70, through a resistor R36.

The voltage across the sensing resistor R15 is compared with the programming voltage (with a 10:1 attenuation), and any difference between the two will cause a change in the current through Q47 with a corresponding change in the drive voltage on the bases of Q15, Q16 (or Q22, Q24). This will produce a corresponding change in the current through the sensing resistor R15, and ultimately reduces the feedback error to near zero. Any change in the programming voltage similarly will result in a corresponding change in the switch current. The values of the resistors R34, R35, R36 and R37 are, in the preferred embodiment, fixed relative to one another in such fashion as to provide a 10mA/volt transfer characteristic. That is, a programming voltage variation of 0 to 5 volts will produce a switch current variation of 0 to 50 mA.

Referring now to FIG. 2B, the current sink 38 includes a matched pair of transistor switch circuits 80, 82, generally the same as the switch circuits 60, 62 of the current source 36, but with minor changes to accommodate the different signal conditions. The left-hand switch circuit 80 receives current from the diode bridge terminal 58, with the current passing through a principal transistor Q40 and a Darlington-connected transistor Q39. The composite current flows through a sensing resistor R23 and a diode Q41 connected to the V- rail.

When the inhibit inputs INH and $\overline{\text{INH}}$ are toggled into the inhibit mode, Q31 conducts and transistors Q43 and Q45 of the right-hand switch circuit 82 are turned on to receive current from a return line 84. This current flows through to the sensing resistor R23 and the diode Q44 to the V- rail. As in the current source 36, during this switchover the programmed current is unchanged in magnitude, and is merely steered from the left-hand switch circuit 80 to the right-hand switch circuit 82 without change, thereby enhancing rapid switchover.

The voltage developed across the sensing resistor R23 is directed to a current control amplifier 86 which also receives a comparison control voltage VIOH-PGM. If the sensing resistor voltage is incorrect, the output of amplifier 86 will alter the drive on transistor Q13 to adjust the current through Q30 (or Q31). This in turn alters correspondingly the switch circuit current so as to bring the current through the sensing resistor R23 (and the active switch circuit) to its correct level.

FIGS. 3 and 4 show the details of specific circuitry capable of carrying out the function required of the control amplifiers 70 and 86. These two amplifiers are essentially the same, and their operation is believed to be apparent from the circuit layout. A few comments on the amplifier arrangement may however be helpful.

Referring to FIG. 4 as exemplary, the control amplifier is a basic two-stage design. Transistors Q1 and Q2 form a mirrored current source for the input differential stage. The collector current of Q1 is set to about 200 $\mu$amps. Q3, Q4, Q5 and Q6 form a Darlington-connected differential amplifier, with Q7, Q8 and Q9 forming a current-mirrored collector load.

The Darlington configuration was chosen to lower the input bias current and to allow the inputs to swing closer to the negative rail. Q7 and R7 help keep the initial offset as low as possible by balancing the loads. R38, R39, R40 and R41 allow offset voltage trimming with R40 and R41 being on a thin film resistor network. Q10 and Q11 with R9 form a current source that, through cascode transistor Q12, controls the Q13 programming current source. Q12 is used to keep Q10 and Q11 from exceeding their breakdown limits. C1 sets the dominant pole which in this case yields a closed loop bandwidth of about 2.5 MHz.

Although a specific preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. For use in apparatus for automatically testing multi-pin ICs by applying signals to selected pins and measuring the output response at other pins to each of which is connected an active load of the type including a diode commutation circuit having a supply terminal and an output terminal to be connected to a pin of the device under test; said active load comprising:

first and second matched transistor switch circuits arranged when activated to supply equal output currents;

means connecting the output of one of said transistor switch circuits to said supply terminal of said diode commutation circuit so that when that one transistor switch circuit is turned on its output current can flow through said diode circuit to the corresponding pin connected to said output terminal of said active load;

means connecting the output of the other transistor switch circuit to a return line; and means to regulate the magnitudes of said equal currents through said first and second transistor switch circuits.

2. An active load as in claim 1, including differential means responsive to inhibit signals and coupled to said transistor switch circuits for turning on one or the other thereof.

3. An active load as in claim 2, wherein said differential means includes first and second switch control circuits for said first and second transistor switch circuits respectively;

said switch control circuits each including a control transistor controlled by respective complementary inhibit signals to turn the corresponding control transistors on or off so as to turn on or off the corresponding transistor switch circuits in a complementary manner.

4. An active load as in claim 1, including a single source of current connected to both said switch circuits in parallel so that the current from that source flows through whichever one of said switch circuits has been activated.

5. An active load as in claim 4, wherein said means to regulate the magnitude of the current flowing through said switch circuits comprises a sensing element forming part of said single source of current and connected in series with each of said transistor switch circuits; and
   feedback means connected to said sensing element and operable to control the current through said sensing element.

6. An active load as in claim 5, including first and second switch control circuits for said first and second transistor switch circuits respectively and operable by complementary inhibit signals to turn said switch circuits on and off alternatively;
   said feedback means including means responsive to an applied control signal for setting the magnitude of current produced by said single source of control current thereby to control the magnitude of current flowing through the transistor switch circuit which has been turned on.

7. An active load as in claim 1, wherein said matched transistor switch circuits each includes a pair of Darlington-connected transistors including a principal current-carrying transistor and a supplementary transistor to carry the base current of said principal transistor.

8. An active load as in claim 7, wherein said matched transistor switch circuits each includes a third transistor coupled to the base of said principal transistor to pull charge out of said base when that switch circuit is turned off.

9. An active load as in claim 8, including differential means responsive to complementary inhibit signals and coupled to the bases of said supplementary transistor and said third transistor;
   said differential means comprising first and second current control circuits having first and second control transistors in series therewith;
   said control transistors being turned on and off out of phase with one another by said complementary inhibit signals, thereby to turn said switch circuits on and off in out of phase fashion.

10. An active load as in claim 9, wherein said first and second current control circuits include first and second diodes to supply control signals to the supplementary transistor and the third transistor of the corresponding switch circuit.

* * * * *